United States Patent [19]
Sheen et al.

[11] Patent Number: 5,902,122
[45] Date of Patent: May 11, 1999

[54] METHOD OF MANUFACTURING AN ILD LAYER BY PLASMA TREATMENT BEFORE APPLYING SOG

[75] Inventors: Dong Sun Sheen; Jeong Rae Lee, both of Ichon, Rep. of Korea

[73] Assignee: Hyundai Electronics Industries Co., Ltd., Kyungki-Do, Rep. of Korea

[21] Appl. No.: 08/772,169

[22] Filed: Dec. 20, 1996

[30]   Foreign Application Priority Data

Dec. 23, 1995 [KR] Rep. of Korea ............... 95-55134

[51] Int. Cl.⁶ ...................................... H01L 21/316
[52] U.S. Cl. .................................................. 438/224
[58] Field of Search ............................ 437/235, 238; 438/624, 631, 763, 778

[56]          References Cited

U.S. PATENT DOCUMENTS

| | | | |
|---|---|---|---|
| 5,270,267 | 12/1993 | Ouellet . | |
| 5,314,724 | 5/1994 | Tsukune et al. | 427/489 |
| 5,334,554 | 8/1994 | Lin et al. | 437/231 |
| 5,413,963 | 5/1995 | Yen et al. . | |
| 5,484,749 | 1/1996 | Maeda et al. | 437/238 |
| 5,554,567 | 9/1996 | Wang | 437/195 |
| 5,556,806 | 9/1996 | Pan et al. | 437/195 |
| 5,656,123 | 8/1997 | Saliman et al. | 156/345 |
| 5,665,635 | 9/1997 | Kwon et al. | 438/427 |

*Primary Examiner*—Charles L. Bowers, Jr.
*Assistant Examiner*—Matthew Whipple

[57]           ABSTRACT

A method of manufacturing a semiconductor device is provided. A first interlayer insulating layer is formed on a silicon substrate, and a lower metal layer is formed on the first interlayer insulating layer. A first insulating layer is formed on the first interlayer insulating layer including the lower metal layer, moisture contained in the first insulating layer is removed by $N_2$ or $N_2O$ plasma. Thereafter, a SOG layer and a second insulating layer are sequentially formed on the first insulating layer.

1 Claim, 2 Drawing Sheets

METHOD OF MANUFACTURING AN ILD LAYER BY PLASMA TREATMENT BEFORE APPLYING SOG

BACKGROUND OF THE INVENTION

1. Field of the Invention

The present invention relates to a method of manufacturing a semiconductor device, and more particularly to a method of manufacturing a semiconductor device, which can prevent peeling or cracking of the SOG (spin on glass) layer used for planarization of an interlayer insulating layer in a multi-level metal layered structure.

2. Description of the Prior Art

In a semiconductor device having multi-level metal layered structure, an interlayer insulating layer is formed to insulate between the lower metal layer and the upper metal layer. The interlayer insulating layer consists of a plurality of insulating layers, including a SOG layer to improve a planarization of surface. The SOG layer has good surface planarization, however, it contains a large amount of moisture therein due to its strongly hydrophilic property. Therefore, an insulating layer is formed before forming the SOG layer to prevent penetration of moisture contained in the SOG layer into the lower metal layer.

However, moisture in the atmosphere is absorbed into, or adsorbed onto, the insulating layer after forming the insulating layer according to the condition of the insulating layer. The moisture contained in the insulating layer causes peeling or cracking of the SOG layer when the SOG layer is cured.

FIGS. 1A and 1B are sectional views for illustrating a conventional method of manufacturing a semiconductor device.

Referring to FIG. 1A, a first interlayer insulating layer 2 is formed on a silicon substrate 1, and a lower metal layer 3 is then formed on the first interlayer insulating layer 2 by a metal wiring process. A first insulating layer 4 is formed on the first interlayer insulating layer 2 including the lower metal layer 3.

In general, the first insulating layer 4 is a TEOS oxide layer, a $SiH_4$ oxide layer or an extra-silicon oxide layer which is formed by a plasma chemical vapor deposition method. During the waiting time for the next process, micro waterdrops 7 are created on the surface of the first insulating layer 4 because of property of the first insulating layer 4. That is, the TEOS oxide layer absorbs moisture therein, $SiH_4$ oxide layer absorbs and adsorbs moisture therein and the extra-silicon oxide layer adsorbs moisture on the surface thereof.

Referring to FIG. 1B, a SOG layer 5 is coated on the first insulating layer 4, and a curing process is then performed. An second insulating layer, an upper metal and a second interlayer insulating layer (not shown) are sequentially formed on the SOG layer 5. At high temperature, the waterdrops 7 created on the first insulating layer 4 are vaporized, therefore, a portion of the SOG layer 5 peels off or cracks due to the vapor pressure. As shown in FIG. 1B, a defective portion 6 of the SOG layer 5 results after the curing process.

The defective portion 6, as described above, results more excessively at the boundary between the SOG layer 5 and the lower metal layer 3. The peeling and cracking of the SOG layer 5 become factors that impede an effectiveness of subsequent processes. The greater the time interval from completion of forming the first insulating layer 4 to commencement of forming the SOG layer 5, the greater the likelihood of forming these defective portions 6.

SUMMARY OF THE INVENTION

It is, therefore, an object of the present invention to provide a method of manufacturing a semiconductor device, which can prevent the peeling and cracking of the SOG layer used for planarization of an interlayer insulating layer.

In accordance with the aforementioned objective, there is provided a method of manufacturing a semiconductor device. A first interlayer insulating layer is formed on a silicon substrate, and a lower metal layer is formed on the first interlayer insulating layer. A first insulating layer is formed on the first interlayer insulating layer including the lower metal layer and moisture contained in the first insulating layer is removed by $N_2$ or $N_2O$ plasma. A SOG layer and a second insulating layer are sequentially formed and an upper metal layer is then formed on the second insulating layer.

BRIEF DESCRIPTION OF THE DRAWINGS

Other objects and advantages of the present invention will be understood by reading the detailed explanation of the embodiment with reference to the accompanying drawings in which.

DETAILED DESCRIPTION OF PREFERRED EMBODIMENT

A detailed description of the present invention is given below with reference to the accompanying drawings.

Figure 1A:
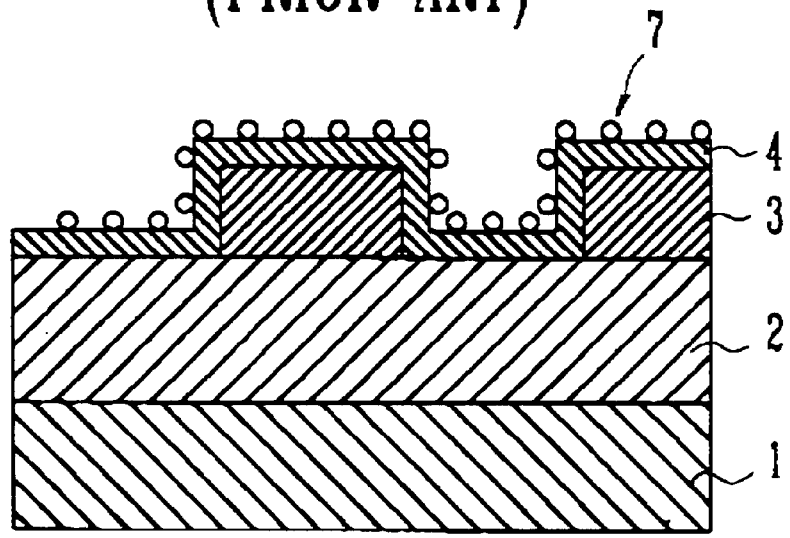
FIGS. 1A and 1B are cross-sectional views for illustrating the prior art method of forming a semiconductor device.
Figure 1B:
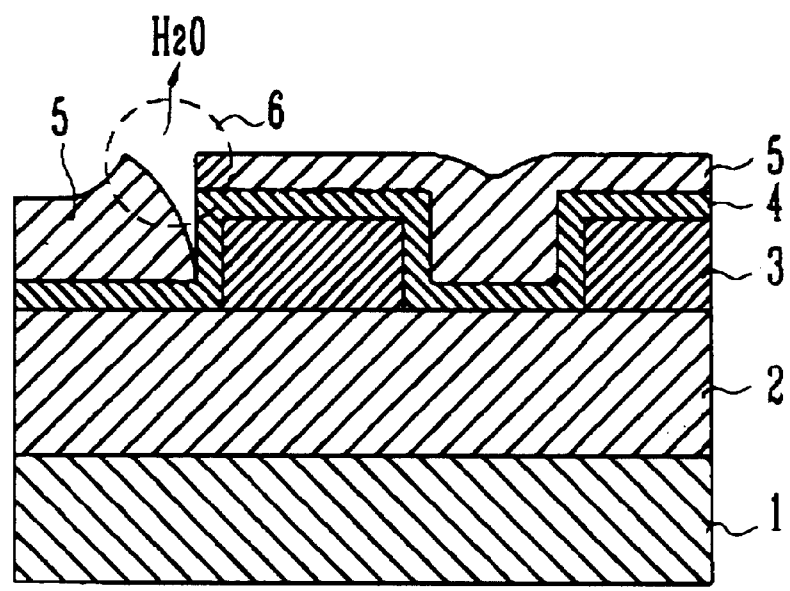
Figure 2A:
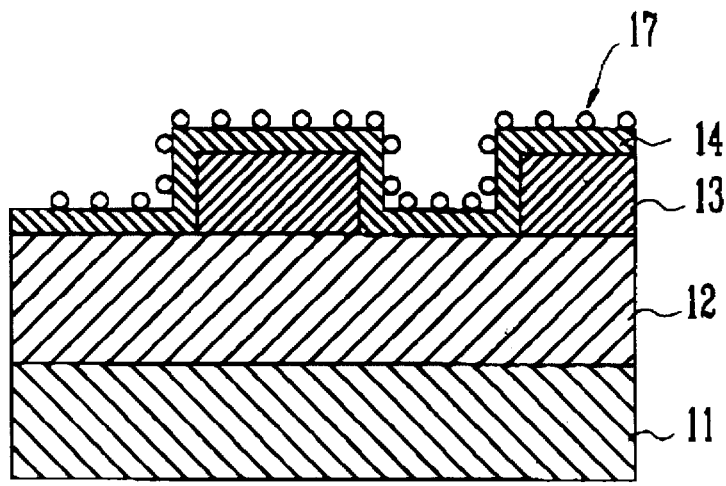
FIGS. 2A, 2B and FIG. 2C are cross-sectional views for illustrating a method of forming a semiconductor device according to the present invention.

Referring to FIG. 2A, a first interlayer insulating layer 12 is formed on a silicon substrate 11, and a lower metal layer 13 is formed on the first interlayer insulating layer 12 by a metal wiring process. A first insulating layer 14 is formed on the first interlayer insulating layer 12 including the lower metal layer 13.

The first insulating layer 14 is a TEOS oxide layer, a $SiH_4$ oxide layer or an extra-silicon oxide layer which is formed by a plasma chemical vapor deposition method. During the waiting time for the next process, micro waterdrops 17 are created on the surface of the first insulating layer 14 because of hydrophilic property of the first insulating layer 14. That is, the TEOS oxide layer absorbs moisture therein, the $SiH_4$ oxide layer absorbs and adsorbs moisture therein and the extra-silicon oxide layer adsorbs moisture on the surface thereof.

Figure 2B:
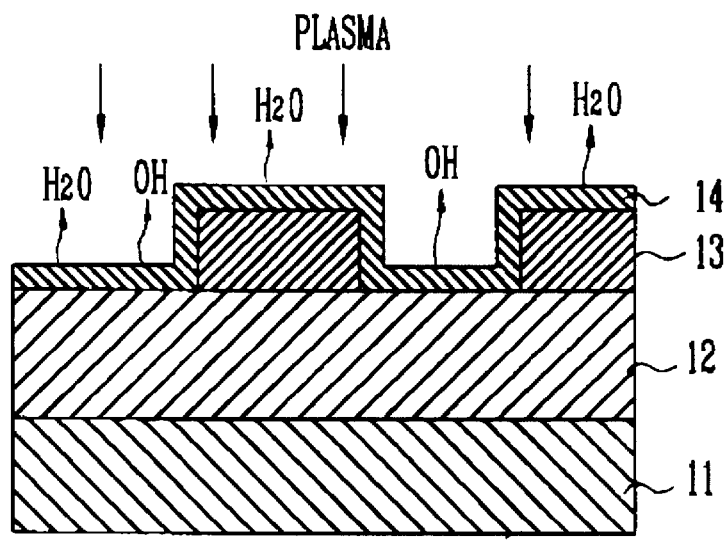

Referring to FIG. 2B, $N_2$ or $N_2O$ plasma is supplied to the first insulating layer 14, therefore, the micro waterdrops 17 created on the first insulating layer 14 are vaporized by the $N_2$ or $N_2O$ plasma. Also, $N_2$ or $N_2O$ plasma reacts with $H_2O$ to replace the Si—OH bonding in the first insulating layer 14 with Si—O bonding or Si—N bonding, thus, the OH radical is removed.

The preferred conditions of process chamber for performing the vaporization process, as described above, is to set at the pressure in the range of 1 to 3 Torrs., and the temperature between 300 and 450° C. (this temperature is the same as the deposition temperature of the first insulating layer). At these conditions, $N_2$ or $N_2O$ gas is supplied into the process chamber at a flow rate of 0.5 to 5 SLM, and RF power is applied. Thus, $N_2$ or $N_2O$ plasma is generated and supplied to the wafer. Preferably, to obtain the positive effects of $N_2$ or $N_2O$ plasma, a RF power with a high frequency of 13.56 MHz and another RF power with a low frequency of 400 to 500 KHz are simultaneously applied. At this time, the ratio of the RF power with a high frequency and the RF power with low frequency is 0.2 through 0.9:1.

Figure 2C:
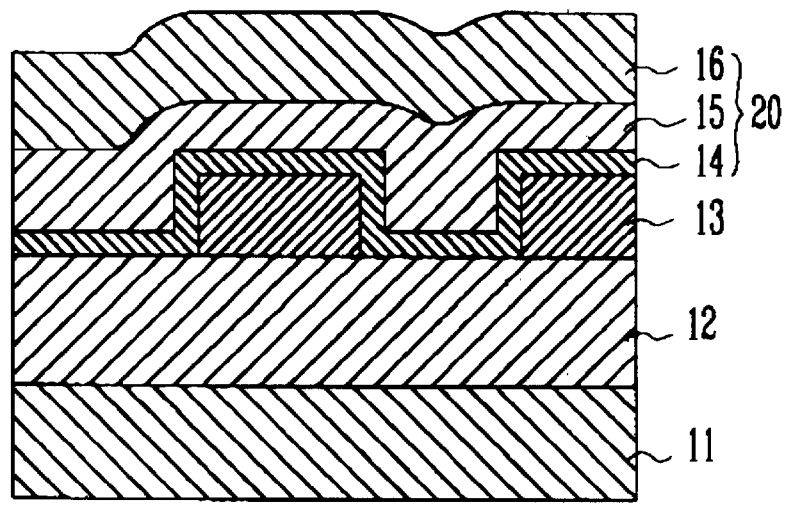

Referring to FIG. 2C, a SOG layer 15 is coated on the first insulating layer 14 in which the moisture is removed to achieve planarization of the interlayer insulating layer, and a curing process is then performed. Thus, the stable SOG layer 15 is formed. A second insulating layer 16 is formed on the SOG layer 15, thus, a second interlayer insulating layer 20 consisting of the first insulating layer 14, the SOG layer 15 and the second insulating layer 16 is formed. An upper metal layer (not shown) is formed on the second interlayer insulating layer 20.

As described above, since $N_2$ or $N_2O$ plasma treatment to the first insulating layer 14 is performed prior to forming the SOG layer 15 on the first insulating layer 14 which prevents penetration of moisture contained in the SOG layer 15 into the lower metal layer 13 in order to remove the moisture absorbed in and adsorbed on the first insulating layer 14, peeling or cracking of the SOG layer 15 caused by moisture contained in the first insulating layer 14 does not result after curing process for the SOG layer 15 coated on the first insulating layer 14. Therefore, the reliability of the semiconductor device is improved and yield is increased.

Many modifications and variations may be made in the techniques and structures described and illustrated herein without departing from the spirit and scope of the present invention. Accordingly, it should be understood that the techniques and structures described and illustrated herein are illustrative only and are not to be considered as limitations upon the scope and spirit of the present invention.

What is claimed is:

1. A method of manufacturing a semiconductor device comprising the steps of:

forming a first interlayer insulating layer on a silicon substrate;

forming a lower metal layer on said first interlayer insulating layer;

forming a first insulating layer using a plasma chemical vapor deposition method on said first interlayer insulating layer including said lower metal layer;

removing moisture contained in said first insulating layer by plasma which is generated by applying any one of a $N_2$ gas and $N_2O$ gas with a flow rate of 0.5 to 5 SLM and simultaneously applying RF power having a high frequency of 13.56 MHZ and a low frequency of 400 to 500 MHZ at 1 to 3 Torr at a temperature between 300 and 450 degrees Celsius;

sequentially forming a SOG layer and a second insulating layer; and forming an upper metal layer on said second insulating layer.

* * * * *